United States Patent [19]

Baum et al.

[11] Patent Number: 5,684,360

[45] Date of Patent: Nov. 4, 1997

[54] ELECTRON SOURCES UTILIZING NEGATIVE ELECTRON AFFINITY PHOTOCATHODES WITH ULTRA-SMALL EMISSION AREAS

[75] Inventors: Aaron Wolf Baum, San Francisco; Kenneth A. Costello, Union City, both of Calif.

[73] Assignees: Intevac, Inc., Santa Clara; Board of Trustees of the Leland Stanford Jr. University, Stanford, both of Calif.

[21] Appl. No.: 499,945

[22] Filed: Jul. 10, 1995

[51] Int. Cl.⁶ .................................................. H01J 40/06

[52] U.S. Cl. .................... 313/542; 313/530; 313/541; 313/539; 313/544

[58] Field of Search .................................. 313/524, 530, 313/541, 542, 544, 539, 523; 250/214 VT, 423 P, 492.2, 492.24, 211 R

[56] References Cited

U.S. PATENT DOCUMENTS

| | | | |
|---|---|---|---|
| 4,460,831 | 7/1984 | Oettinger et al. | 250/492.2 |
| 4,820,927 | 4/1989 | Langner et al. | 250/492.2 |
| 4,868,380 | 9/1989 | Booman et al. | 250/211 R |
| 4,906,894 | 3/1990 | Miyawaki et al. | 313/542 |
| 4,970,392 | 11/1990 | Oettinger et al. | 250/423 P |
| 5,039,862 | 8/1991 | Smith et al. | 250/432 P |

OTHER PUBLICATIONS

A. Herrera–Gomez et al, SPIE vol. 2022, Photodetectors and Power Meters Jul. (1993), p. 51.

A. Herrera–Gomez et al. SPIE vol. 2922. Entitled: Physics of High Intensity Nanosecond Electron Source Jul. 1993.

Colin A. Stanford, Doctoral Thesis, Cornell University Dept. of Electrical Engineering May (1990), Entitled: Laser Pulsed GaAs Negative Electron Affinity Photocathodes for Electron Beam Instrumentation.

*Primary Examiner*—Nimeshkumar Patel
*Attorney, Agent, or Firm*—Stanley Z. Cole; William R. McClellan

[57] ABSTRACT

An electron source includes a negative electron affinity photocathode on a light-transmissive substrate and a light beam generator for directing a light beam through the substrate at the photocathode for exciting electrons into the conduction band. The photocathode has at least one active area for emission of electrons with dimensions of less than about two micrometers. The electron source further includes electron optics for forming the electrons into an electron beam and a vacuum enclosure for maintaining the photocathode at high vacuum. In one embodiment, the active emission area of the photocathode is defined by the light beam that is incident on the photocathode. In another embodiment, the active emission area of the photocathode is predefined by surface modification of the photocathode. The source provides very high brightness from an ultra-small active emission area of the photocathode.

31 Claims, 9 Drawing Sheets

ELECTRON SOURCES UTILIZING NEGATIVE ELECTRON AFFINITY PHOTOCATHODES WITH ULTRA-SMALL EMISSION AREAS

FIELD OF THE INVENTION

This invention relates to electron beam sources and, more particularly, to electron sources which utilize negative electron affinity photocathodes with one or more ultra-small active emission areas to produce high brightness, small diameter electron beams.

BACKGROUND OF THE INVENTION

High resolution electron beam systems include scanning electron microscopes, defect detection tools, VLSI testing tools and mask making and wafer exposure tools. In general, these systems include an electron source and electron optics for accelerating the electrons into an electron beam and focusing the electrons onto a target. These systems require an electron source with a high brightness and a small source size. Field emission electron sources have frequently been used in high resolution electron beam systems.

Negative electron affinity (NEA) photocathode electron sources have been proposed in the prior art. A negative electron affinity photocathode includes a semiconductor, usually a III-V compound such as gallium arsenide, heavily p-doped so as to raise the conduction band relative to the Fermi level. The semiconductor surface is coated with an activation layer, a few monolayers thick which lowers the work function so that the conduction band in the bulk is above the vacuum level, a condition of negative electron affinity. When electrons are excited by light energy into the conduction band within a diffusion length (typically a few micrometers) of the surface, many of them will diffuse to the surface where they will have a high probability of escaping into the vacuum, as described by A. Herrera-Gomez and W. E. Spicer in SPIE Vol. 2022, Photodetectors and Power Meters (1993), p. 51.

Most previous work on NEA photocathode electron sources has been performed on reflection mode photocathodes. In this mode, a light beam is incident on the emitting surface of the cathode, and, due to the need for electron optics above the cathode surface for accelerating and focusing the emitted electrons, the final lens used to focus the light cannot be positioned close to the photocathode. This necessitates low numerical aperture imaging, which results in large spot sizes and emission areas, typically at least a few tens of micrometers.

C. Sanford, as described in Doctoral Thesis, Cornell University Dept. of Electrical Engineering (1990), constructed free-standing membrane transmission mode photocathodes, as well as NEA photocathodes with integrated gate electrodes. In the former case, the final lens of the light optics was over 10 centimeters from the cathode. The emission area was estimated to be approximately 15 micrometers in diameter. In the second case, a flood illumination was used, and the emitting areas were greater than 100 micrometers in diameter.

A scanned electron beam system, including an electron beam source using an NEA activated photoemitter as the cathode, is disclosed in U.S. Pat. No. 4,820,927 issued Apr. 11, 1989 to Langner et al. The disclosed electron source is operated in the transmission mode and is stated to have a typical cathode emitting diameter of 18.75 micrometers. U.S. Pat. No. 4,970,392 issued Nov. 13, 1990 emphasizes the need for high brightness electron sources, but contains no discussion of the importance of emission area. Electron beam sources utilizing photocathodes are also disclosed in U.S. Pat. No. 4,460,831 issued Jul. 17, 1984 to Oettinger et al; U.S. Pat. No. 5,039,862 issued Aug. 13, 1991 to Smith et al; and U.S. Pat. No. 4,906,894 issued Mar. 6, 1990 to Miyawaki et al. The disclosed electron sources and systems do not provide for the achievement of the small spot sizes achievable by the present invention, and thus, for reasons explained below, cannot provide the high brightness necessary for high-performance electron beam instrumentation.

SUMMARY OF THE INVENTION

According to the present invention, an electron source comprises a negative electron affinity photocathode on a light-transmissive substrate and a light beam generator for directing a light beam through the light-transmissive substrate at the photocathode for exciting electrons into the conduction band of the photocathode. The photocathode has at least one active area for emission of electrons. The active area has one or more dimensions less than about two micrometers. The electron source further comprises electron optics for forming the electrons emitted from the active area of the photocathode into an electron beam and a vacuum enclosure for maintaining the photocathode at ultra high vacuum.

In one embodiment, the active emission area of the photocathode is defined by the light beam that is incident on the photocathode. The light beam generator preferably comprises a light source for generating light and optical elements for focusing the light into a light beam having predetermined dimensions at the photocathode. In another configuration, the light beam generator may include means for directing two or more light beams at two or more corresponding active areas of the photocathode, thereby generating two or more electron beams. In yet another configuration, the light beam generator may include means for scanning the light beam over the surface of the cathode to thereby move the electron beam with respect to the electron optics. The light beam may be continuous wave or may be modulated.

In another embodiment, the active area of the photocathode is predefined by surface modification of the photocathode. The active area may be established by a blocking layer in or on the photocathode. The blocking layer, which may comprise a metal or semi-metal film, has at least one opening which defines the active emission area of the photocathode. The blocking layer may comprise an ohmic contact having one or more openings that define active emission areas. Alternatively, the surface of the photocathode may be treated to have a high density of defects, which cause electron recombination except in the active emission area.

The photocathode typically comprises a semiconductor, such as a Column III-V compound. The photocathode may further include an activation layer for lowering the work function at the surface of the cathode. The active, light absorbing region of the photocathode typically has a thickness of about one micrometer or less to limit lateral diffusion of electrons from the active area. The photocathode may be provided with a bandgap ramp through the thickness thereof for producing an electric field within the photocathode.

The electron source of the present invention produces very high brightness in a very small active emission area of the photocathode, thus providing high current densities. Because the electron beam has a small diameter, low demagnification is required in high resolution electron beam systems.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
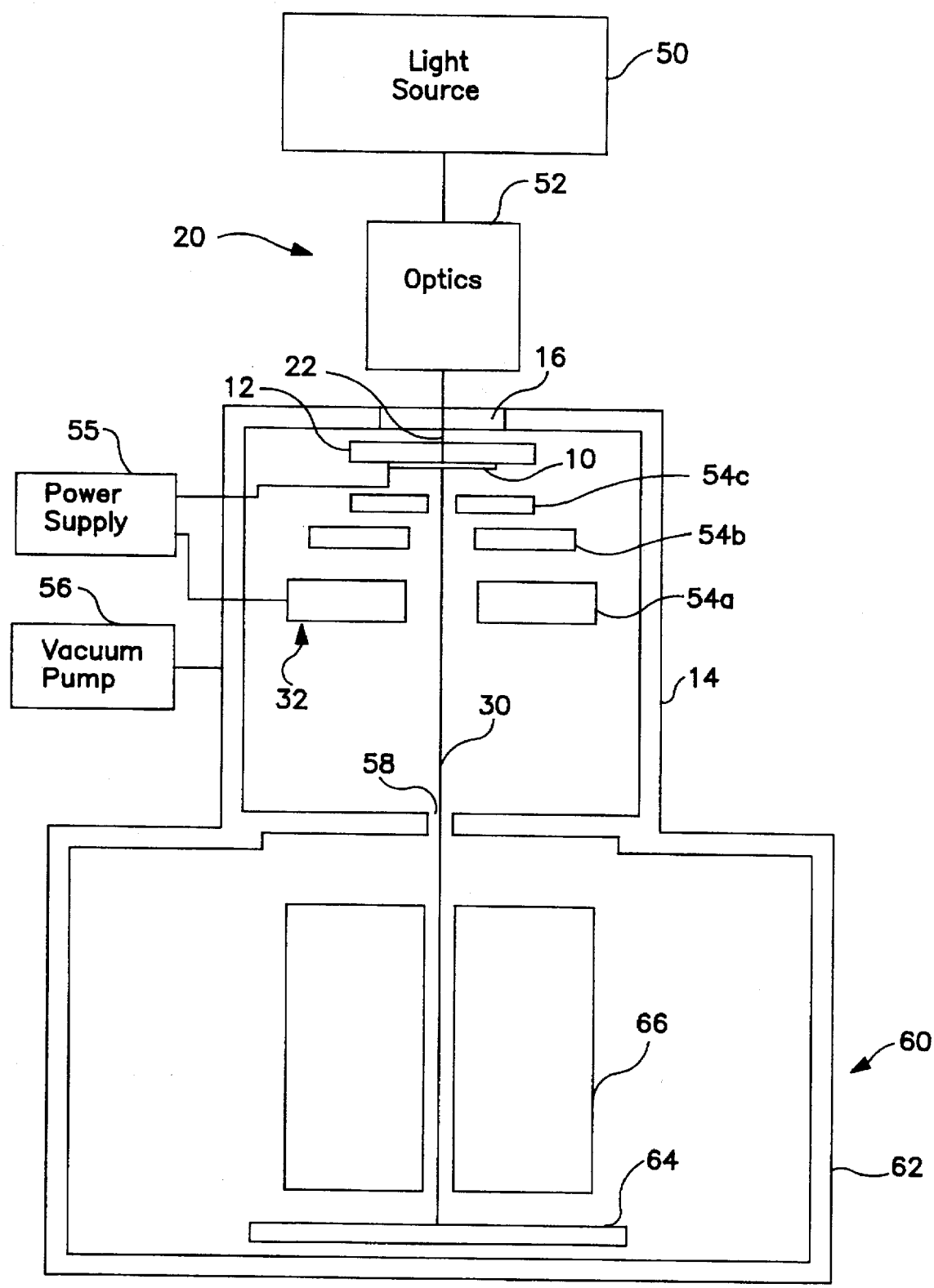
FIG. 1 is a block diagram of an example of an electron beam system utilizing an electron source in accordance with the present invention.
Figure 2:
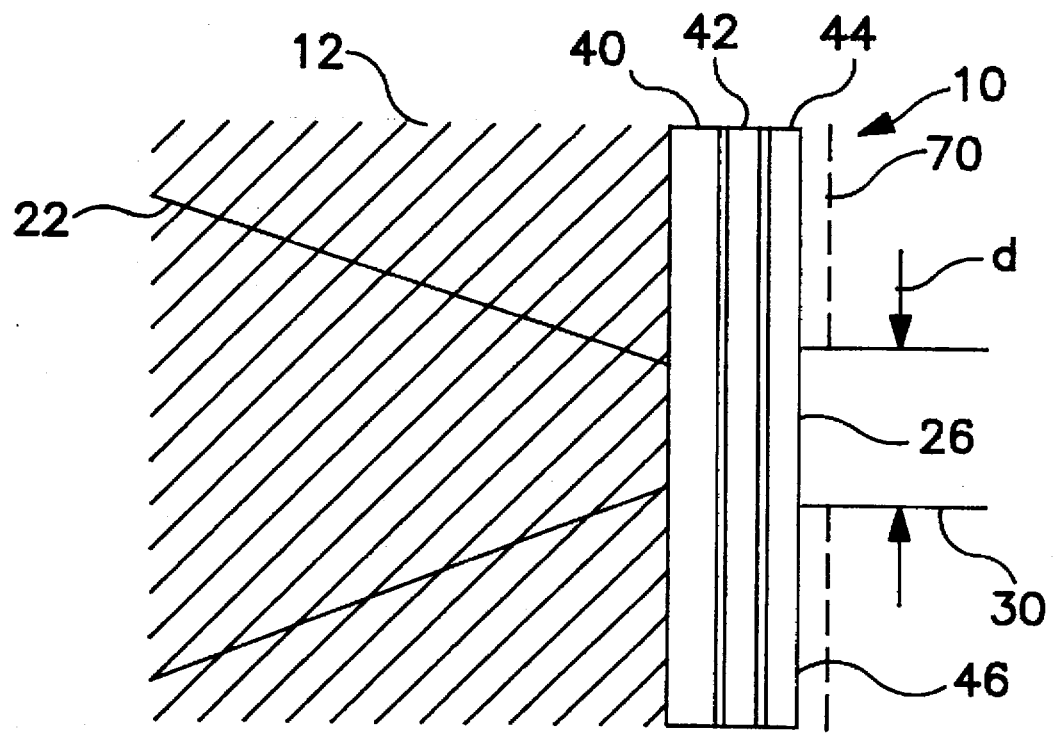
FIG. 2 is a partial cross-sectional view of the photocathode in the electron source of FIG. 1.

A block diagram of an example of an electron beam system utilizing an electron source in accordance with the present invention is shown in FIG. 1. A photocathode 10 is located on a surface of a light-transmissive substrate 12. An enlarged partial cross-sectional view of substrate 12 and photocathode 10 is shown in FIG. 2. The photocathode 10 is located within a vacuum enclosure 14 that maintains an ultra-high vacuum environment during operation. The vacuum enclosure 14 includes a vacuum window 16 for transmission of a light beam as described below. In an alternative configuration, the light-transmissive substrate 12 may form part of the vacuum enclosure wall. A light beam generator 20 directs a light beam 22 through vacuum window 16 and substrate 12 to an active area 26 (see FIG. 2) of photocathode 10. The light beam 22 causes the active area 26 of photocathode 10 to emit electrons into the vacuum region defined by vacuum enclosure 14. The electrons are formed into an electron beam 30 by electron optics 32.

In accordance with an important aspect of the invention, the active emission area 26 of photocathode 10 has a dimension d parallel to the surface of photocathode 10 that is preferably about two micrometers or less and is mostly preferably about one micrometer or less. The active area 26 is typically more or less circular in shape, but is not limited to a circular shape. For example, the active area 26 may be in the form of a line, where the linewidth has a dimension d as described above. Additionally, the active area may comprise a predetermined pattern on photocathode 10. The advantages of using a very small active area 26 (dimension d less than about two micrometers) are discussed below. The photocathode 10 may have one active emission area 26 as shown in FIG. 2 and described above. Alternatively, the photocathode 10 may have two or more active emission areas 26.

The active emission area 26 of photocathode 10 may be defined in two ways. In a first approach, the active emission area is defined by and is a direct result of light beam 22. Typically, the dimension d of the active area 26 is approximately equal to the cross sectional diameter of the light beam 22. The active area 26 of electron emission may be somewhat larger than light beam 22 due to lateral spreading of electrons within photocathode 10. In this approach, movement of the light beam 22 causes the active area 26 to move relative to photocathode 10.

In a second approach, the active emission area 26 is predefined by surface modification of photocathode 10. For example, the photocathode 10 may be coated with a thin blocking layer, such as aluminum, having at least one opening that defines active area 26. In an alternative approach, photocathode 10 may be subjected to ion implantation over its surface area except in active area 26. The ion implantation produces defects in the photocathode material, which reduce its effectiveness as an electron emitter. When the active area 26 is defined by surface modification of the photocathode, electron emission is caused by light beam 22. However, the active area 26 is fixed in position with respect to photocathode 10. In addition, since the dimension of the active area 26 is defined by surface modification, the light beam 22 is not required to be as small as the active area 26.

Figure 3:
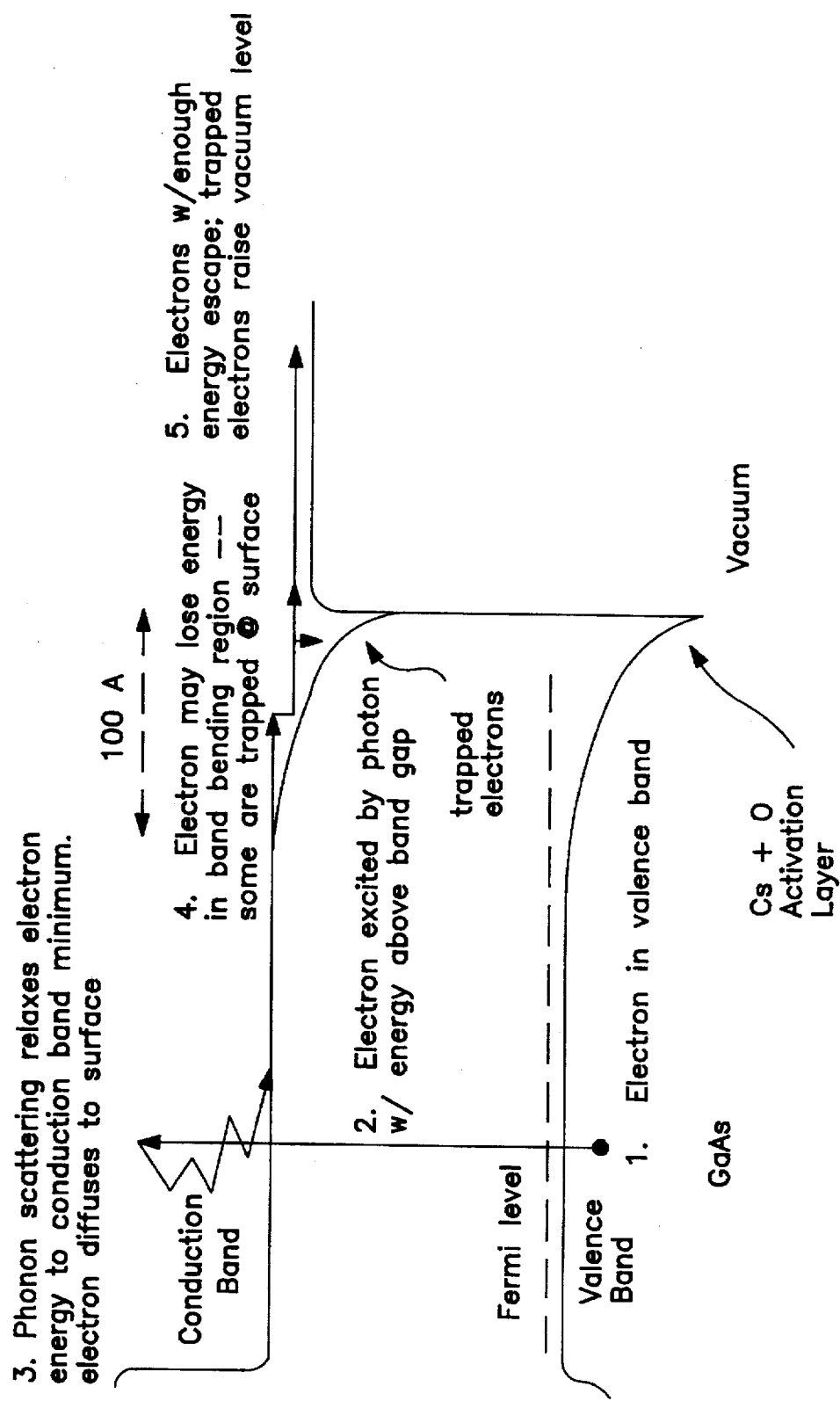
FIG. 3 is an energy level diagram that illustrates negative electron affinity photoemission.

The photocathode 10 is a negative electron affinity photocathode. The basic principle of negative electron affinity electron emission is illustrated in FIG. 3. The photocathode comprises a semiconductor, usually a Column III-V compound such as gallium arsenide, heavily p-doped ($1-5\times10^{19}$) with a material such as zinc, magnesium, or carbon, so as to raise the conduction band relative to the Fermi level. The cleaned semiconductor surface is exposed to cesium and oxygen to form an activating layer a few monolayers thick. The activation layer lowers the work function so that the conduction band in the bulk is above the vacuum level, the condition of negative electron affinity. When electrons are excited from the valence band into the conduction band within a diffusion length (typically a few micrometers) of the surface, many of the electrons diffuse to the surface, where they have a high probability of escaping the surface into the vacuum.

In general, the photocathode may be any material that meets the negative electron affinity condition specified above. The photocathode is typically a semiconductor material. Compounds of Column III materials such as gallium, aluminum and indium and Column V materials such as phosphorous, arsenic and nitrogen are typically used. Other suitable NEA materials include diamond, silicon carbide, aluminum nitride and gallium nitride. Some NEA materials may not require an activation layer. The activation layer may alternately be formed by exposure to cesium only or cesium and nitrogen trifluoride; other potentially low work function materials may also be used. The photocathode 10 is preferably very thin to limit lateral spreading of electrons within the photocathode, which would increase the dimension of the active area 26. Preferred thicknesses of cathode 10 are about one micrometer or less.

The photocathode 10 may optionally include a bandgap ramp which produces an electric field through the thickness of the photocathode. Bandgap ramps are described generally in U.S. Pat. No. 3,631,303 issued Dec. 28, 1971 to Antypas et al. The bandgap ramp may be produced by a density gradient in a constituent of the photocathode material. For example, an aluminum gallium arsenide photocathode may have a variable density of aluminum through its thickness. The purpose of the electric field within the photocathode material is to direct electrons toward the photocathode surface into the vacuum and to limit lateral movement of electrons within the photocathode material. As indicated, lateral movement of electrons tends to increase the lateral dimension of the active emission area of photocathode 10.

An example of a suitable photocathode 10 is described with reference to FIG. 2. An anti-reflection coating 40 is affixed to the surface of light-transmissive substrate 12. The substrate 12 should be substantially transparent to the wavelength or wavelengths of the light beam 22. A preferred substrate is glass. The anti-reflection coating is made of one or more layers of material with thicknesses and refractive indices chosen to minimize reflection of the illuminating light at the interface between the substrate glass and the cathode structure. Suitable anti-reflection coatings include silicon nitride and silicon oxynitride having a thickness of one quarter of the excitation wavelength. The photocathode 10 includes a diffusion blocking layer 42 on anti-reflection coating 40, followed by an active layer 44 having a surface activation layer 46. In a preferred embodiment, the diffusion blocking layer 42 comprises an AlGaAs or AlGaAsP layer having a thickness, typically from approximately 400 angstroms to a few micrometers, that minimizes absorption at the illuminating wavelength while forming an energy barrier to the diffusion of electrons in the conduction band of the active layer without promoting their recombination. The active layer comprises GaAs, GaAsp, AlGaAs or InGaAsP having a thickness of about one micrometer or less, and the activation layer 46 comprises $Cs_xO_y$ that is a few atoms thick.

The photocathode is maintained at ultra high vacuum so that the activating layer is not contaminated and maintains its integrity for a reasonable period of time. Contamination of the activating layer can reduce its effectiveness at lowering the work function of the cathode, possibly reducing or eliminating the condition of negative electron affinity. The vacuum level discussed in connection with negative electron affinity photocathodes is the minimum energy of an electron just above the surface of the cathode; an electron inside the photocathode with an energy less than this value cannot escape and will be trapped at the surface, where it will contribute to the surface trapped electron density.

The light beam generator 20 includes a light source 50 for generating light of a desired wavelength and intensity, and optics 52 for focusing the light into a small diameter beam at the surface of photocathode 10. The light source 50 may comprise a laser or a broadband light source. The broadband light source may include a suitable optical filter to produce light of a desired wavelength or wavelength range. For photocathodes fabricated of Column III-V materials, the wavelength is typically in the range of 300–800 nanometers. The selected wavelength depends on the absorption band of the photocathode material to excite electrons to the conduction band and on the thickness of the photocathode. The power level of the light source 50 is relatively low. Typically, power levels less than 10 milliwatts are required for excitation of photocathode 10. The optics 52 converts the light generated by source 50 into light beam 22 having a desired very small cross-sectional dimension at photocathode 10. As indicated above, the cross-sectional dimension of light beam 22 is preferably less than about two micrometers. This dimension may be achieved using a system of two or more lenses for focusing the image of an aperture on the photocathode, using a high numerical aperture, for minimum diffraction-limited spot size on the active region 26 of photocathode 10. The optics 52 may incorporate correction for spherical aberration of the vacuum window 16 and the substrate 12. The nominal diffraction-limited spot size for an optical system that is fully corrected for spherical and other aberrations is: diameter=wavelength/(2×NA), where NA is the numerical aperture, which is defined as the sine of the semi-angle of convergence of the beam times the refractive index of the medium in which the focusing is taking place. The preferred numerical aperture is at least 0.5.

The transmission configuration illustrated in FIG. 1 wherein the light beam 22 is transmitted through substrate 12 to one side of photocathode 10 and the electron beam 30 is emitted from the other side of photocathode 10, is advantageous in achieving a very small active area 26. In particular, the transmission configuration permits the final lens of the optics to be positioned close to the photocathode 10 and to have a large numerical aperture, thus permitting light beam 22 to have a very small diameter.

The vacuum enclosure 14 is connected through a suitable conduit to a vacuum pump 56 or a combination of vacuum pumps for maintaining the interior of enclosure 14 at ultra high vacuum, typically less than $10^{-9}$ torr. Typically, the required vacuum level may be in a range of $10^{-10}$ to $10^{-11}$ torr. The vacuum window 16 through which light beam 22 passes preferably has very low optical aberrations. The vacuum window 16 may be flat or may be in the form of a lens for further focusing of the light beam 22 from optics 52. The vacuum window 16 should be substantially transparent to the wavelength or wavelengths of light beam 22. The vacuum enclosure 14 includes a diffusion-limiting aperture 58 for limiting the rate of movement of contaminants from the main electron beam column into the electron source region. The electron optics 32 may include one or more electrodes, such as electrodes 54a, 54b, 54c, connected to a power supply 55 which suitably biases the electrodes for forming electron beam 30. The electron beam 30 passes through aperture 58 into main electron beam column 60. The electron beam column includes a vacuum enclosure 62, a workpiece 64, such as a semiconductor wafer, and electron optics 66. The electron beam column in general incorporates all equipment necessary to create a vacuum for the application, to form the electron beam into a probe appropriate for the application, to scan the beam across the workpiece 64, to collect electrons or other particles scattered from the workpiece, to translate the workpiece and any other functions that may be required for the application. Techniques for the design and fabrication of electron beam columns are generally known to those skilled in the art. The electron source comprises the photocathode 10 on substrate 12, light beam generator 20, vacuum enclosure 14 and electron optics 32. The electron source may include additional features such as a load lock (not shown) for replacement of photocathodes and an activation region (not shown) for heat cleaning and activation of the photocathode.

As indicated previously, the active area 26 of photocathode 10 for electron emission can be established by the light beam 22 itself or by modification of the surface of the photocathode 10 to establish one or more predefined active areas. The basic idea of using surface modification to limit the active electron emission area is to alter the surface or near surface structure of the photocathode so that electrons are emitted only from a predefined area. By using high resolution lithographic techniques, the active areas may have much finer structure than is possible by defining the active areas with the light beam. For example, active areas for emission of electrons smaller than 0.1 micrometer may be fabricated. In addition, it is advantageous if the material on the non-emitting surface is efficient at collecting and eliminating the surface-trapped charge, thereby reducing the possibility of cutoff due to the surface-trapped electrons.

One approach is to use a metal layer 70, shown in phantom FIG. 2, deposited on the surface of photocathode 10 or grown into the structure close to the surface or on the surface. The metal layer 70, which may be aluminum, is provided with an opening of dimension that corresponds to the desired dimension d of active emission area 26. The metal layer blocks emission from the covered areas and conducts away the trapped charge more efficiently than bare semiconductor material. Other materials, such as other semiconductors or semimetals, may be deposited on the surface or grown into the structure to block emission of electrons except from a limited active area. Ohmic contacts may be used to define the active emission area.

The area of photocathode 10 which is not to emit electrons may be treated in other ways, such as ion implantation, to alter material properties to thereby prevent electrons from being emitted from these areas. The ion implantation may produce a high density of defects in the non-emitting regions, which prevents electron emission and speeds recombination of surface trapped electrons which entered into the treated region.

The use of NEA photocathodes with extremely small active emission areas less than about two micrometers provides a number of advantages which, taken together, create the possibility of using this configuration in high performance, high resolution electron beam systems, including those that currently use field emission electron sources. The most important of these advantages is the higher brightness obtainable from smaller emission areas, as the surface-trapped electrons which limit current density move out of the active emission area at a high rate. When a semiconductor is in the condition of negative electron affinity, the energy of an electron in the conduction band is greater than that of an electron immediately outside the solid, as illustrated in FIG. 3. This is typically achieved through heavy p-doping and the application of an activation layer that lowers the work function until the NEA condition is achieved. Electrons excited into the conduction band thermalize and diffuse to the surface, where they may be emitted or trapped in the surface region. The trapped electrons form a dipole that tends to cancel out the field of the depletion region at the surface, raising the vacuum energy level relative to the bulk conduction band minimum until emission is blocked. Previous workers have found strong evidence of this effect on large area emission from NEA photocathodes and have found that the trapped electrons are eliminated by holes tunneling or thermionically emitting over the depletion region, as described by A. Herrera-Gomez and W. E. Spicer in SPIE Vol. 2022, Photodetectors and Power Meters (1993), p. 51. The rate of arrival of these holes limited the current density emitted from the cathodes, as increasing the amount of light stimulating the cathode did not increase the emission beyond a certain level.

Figure 4A:
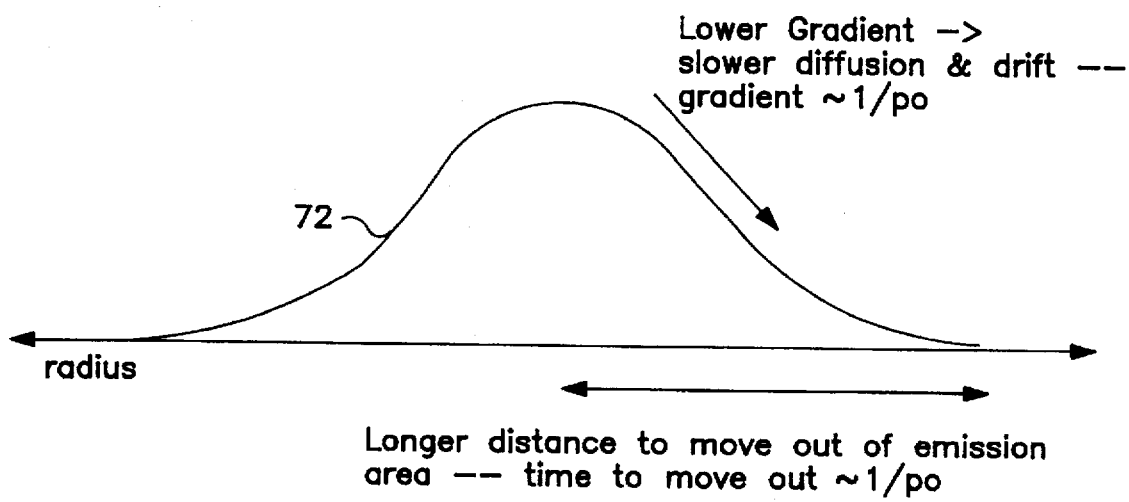
FIGS. 4A and 4B are graphs of trapped electron density as a function of radius for relatively large and relatively small emission areas, respectively.
Figure 4B:
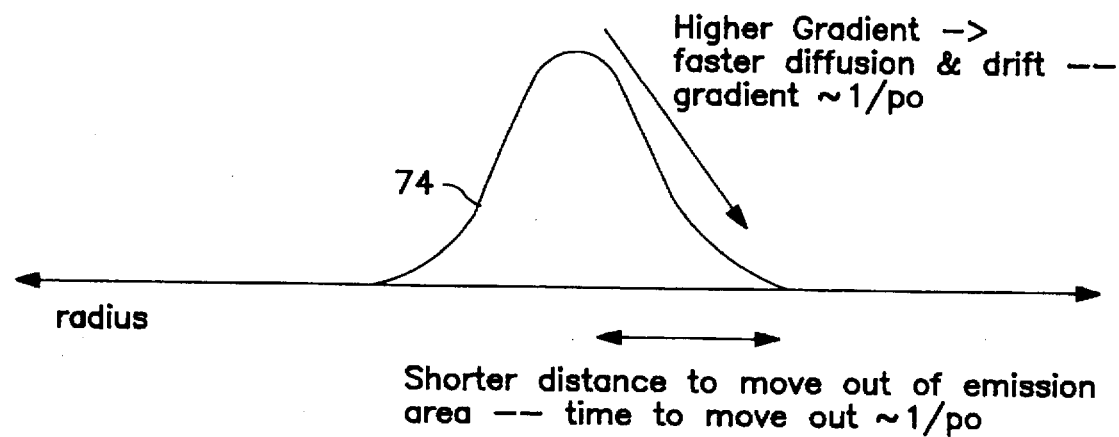

For a very small active emission area, the trapped electrons have an alternate path. Due to the higher lateral gradients of trapped electron density and surface voltage, the trapped electrons are highly likely to diffuse and drift laterally out of the emission area, reducing the dipole. This effect is enhanced for small diameter active emission areas, as illustrated in FIGS. 4A and 4B. Curve 72 in FIG. 4A illustrates the trapped electron density gradient for a relatively large active emission area, and curve 74 in FIG. 4B illustrates the higher trapped electron density gradient that occurs in a very small diameter active emission area. The higher gradient produces faster diffusion and drift of trapped electrons from the active area.

Experiments using a 1.74 micrometer diameter emission area have demonstrated DC current densities over 100 times higher than have previously been reported from an NEA cathode. Since the photocathode active region was approximately 1.5 micrometers thick, the light beam diameter was probably much smaller. A thinner cathode, with a bandgap ramp to push electrons out with minimum lateral diffusion, could achieve a much smaller active emission area, limited ultimately by the diffraction-limited spot size, or by the size of an emission controlling aperture on the surface. The rate of lateral diffusion and drift of the trapped electrons is roughly proportional to $1/d^2$, where d is the active emission area diameter. Thus, going from a 5 micrometer active area to a 0.5 micrometer active area provides 100 times more movement of the trapped electrons, which translates roughly to 100 times greater emitted current density. Thus, the smallest possible active emission area is clearly of great importance to brightness.

A second advantage of a small active emission area is the reduced demagnification necessary in high resolution electron beam systems. Since the amount demagnification in practical electron lenses is limited (typically 25×or less), the use of a smaller active emission area is key to the construction of an electron beam system of convenient size and complexity. Since most such systems currently employ field emission sources which have effective source sizes of amount 10 nanometers or less, it is likely that an NEA source would employ additional demagnification to achieve the same probe size. If this demagnification is to be achieved with one lens, the source size should be significantly smaller than one micrometer, and if possible as small as 0.25 micrometer.

Lower demagnification has a number of advantages in addition to simplifying column design. If multiple beams or patterns are projected from the cathode surface to the workpiece, a larger area of the workpiece can be exposed. This is important because emission from only a limited area of the cathode can be focused onto the workpiece with low aberrations. Thus, a higher throughput can be realized as a greater number of emission points can be used, or a larger area on a target wafer can be written at one time. As described below, the active emission area can be scanned across the cathode surface using light optics, thereby eliminating the need for electron optic scanning. In this case, lower demagnification means a larger scan field.

Finally, using a very small active emission area reduces the total amount of current emitted (although, because of the lower demagnification, the amount used stays the same). In multiple beam and cathode projection systems, beam-beam interaction, a major problem in such systems, is reduced. It is known that for a fixed current density, a smaller emission area gives a lower space-charge induced energy spread. Since lower energy spread is an attractive feature of the NEA cathodes, this is an important consideration. A smaller amount of current emitted increases cathode lifetime, as electron-stimulated desorption of poisoning gases and ionization of residual gases, which can greatly shorten cathode lifetime, are reduced proportionately.

Different embodiments of the light beam generator 20 are shown in FIGS. 5–8. As indicated above, two or more electron beams may be emitted from photocathode 10 by directing two or more corresponding light beams at the photocathode. Each electron beam is emitted from an ultra small active area of the photocathode having dimensions of two micrometers or less. Each electron beam is stimulated by a light beam. Suitable light beam generators are shown schematically in FIGS. 5 and 6.

Figure 5:
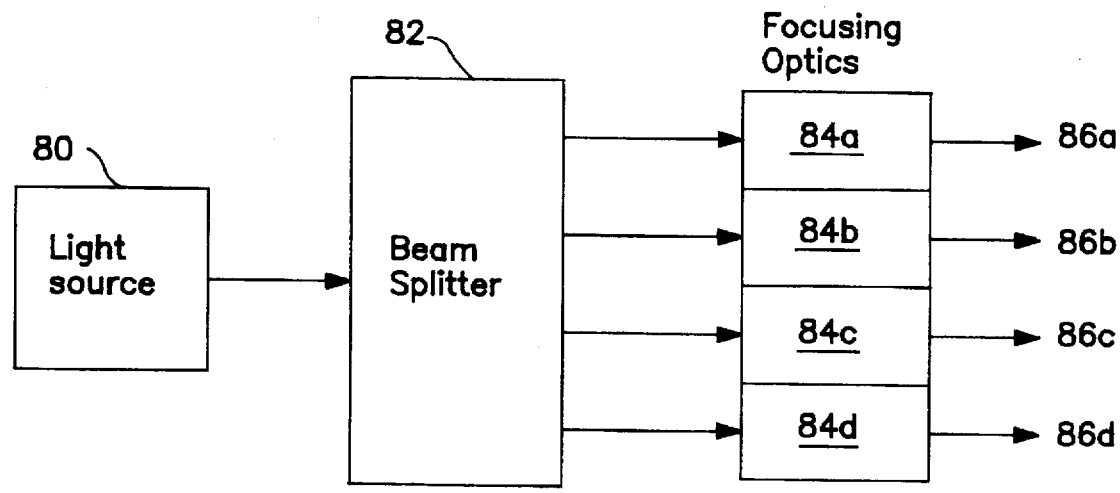
FIGS. 5-8 are block diagrams of different embodiments of the light beam generator.

In FIG. 5 a light source 80 directs a light beam at a beam splitter 82. The beam splitter 82 divides the input beam into two or more light beams which are directed through focusing optics 84a, 84b, 84c and 84d to produce light beams 86a, 86b, 86c and 86d, respectively. Each of the light beams preferably has a cross sectional diameter of two micrometers or less at the surface of photocathode 10 and stimulates emission of electrons from corresponding active areas of photocathode 10. It will be understood that the light beam generator of FIG. 5 can be designed to produce different numbers of light beams.

Figure 6:
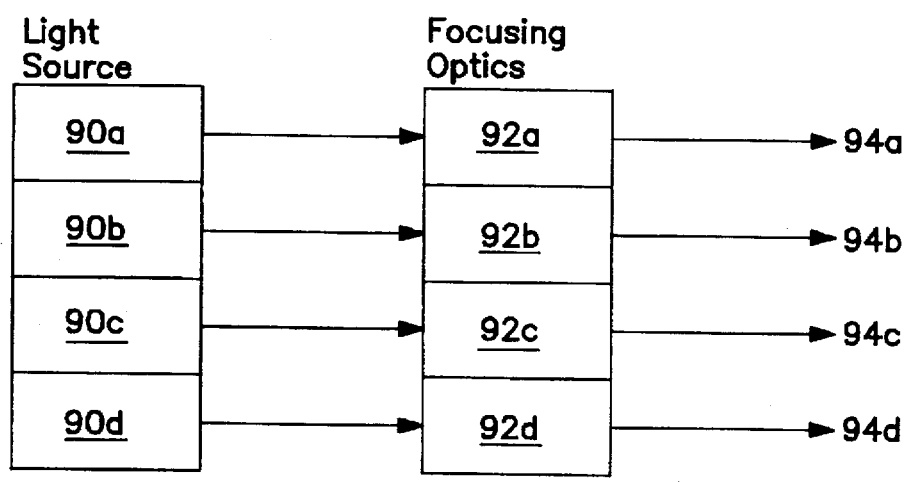

Another light beam generator for generating two or more light beams is illustrated in FIG. 6. Separate light sources 90a, 90b, 90c and 90d direct light at focusing optics 92a, 92b, 92c and 92d to produce light beams 94a, 94b, 94c and 94d, respectively. The light beams are directed at the photocathode 10 and produce corresponding electron beams. An advantage of the embodiment of FIG. 6 is that the light sources 90a, 90b, 90c and 90d may be independently controlled with respect to modulation, power level and the like.

In a further embodiment of the light beam generator 20, a single focusing optics system is used to focus the light output from two or more light sources. In this embodiment, the light sources must be close together. Monolithic arrays of semiconductor lasers or light-emitting diodes may be used. In this way, many independently addressable, closely-spaced (approximately 100 micrometer or less) light sources may be imaged by a single lens system with low aberrations (which increase for larger distances from the optical axis).

Figure 7:
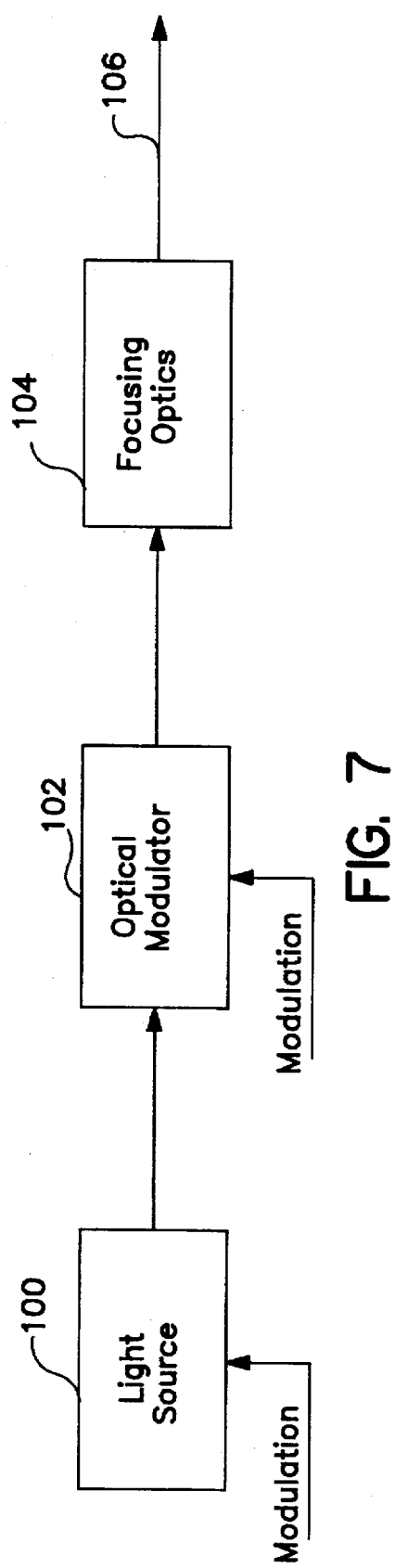

An embodiment of the light beam generator 20 having modulation capabilities illustrated in FIG. 7. A light source 100 directs light through an optical modulator 102 to focusing optics 104. The focusing optics 104 provides a light beam 106, which is directed at an active emission area of photocathode 10. The optical modulator 102 modulates the light beam 106 in accordance with an input modulation signal, which may have any desired waveform, such as, for example, sine wave or pulsed. The light beam 106 may be modulated at frequencies up to the gigahertz range. Alternatively, the light source 100 may be controlled by a modulation signal. For example, a modulation signal may be applied to a laser diode.

Figure 8:
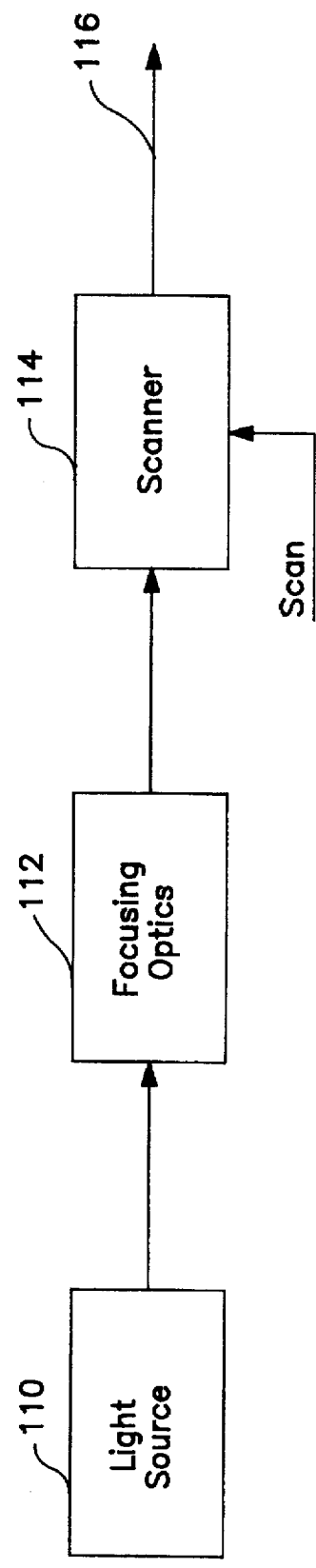

An embodiment of the light beam generator 20 utilizing light beam scanning is shown in FIG. 8. A light source 110 directs light through focusing optics 112 to a light beam scanner 114. The scanner 114 provides a light beam 116 that is scanned over a prescribed range by a scan signal applied to scanner 114. The light beam 116 is scanned over a prescribed region of the photocathode 10 to generate an electron beam that moves across photocathode 10 in accordance with the scanning of light beam 116.

It will be understood that various combinations of the light beam generators shown in FIGS. 1 and 5–8 can be utilized within the scope of the present invention. For example, the multiple light beams shown in FIGS. 5 and 6 may be modulated as shown in FIGS. 7 and/or may be scanned as shown in FIG. 8. The various light beam generators may be utilized in the mode where the active emission area or areas of the photocathode are defined by the incident light beam or the mode where the active emission area or areas are predefined by surface modification of the photocathode 10. When scanning of the light beam is used in conjunction with a photocathode having one or more active emission areas that are predefined by surface modification, an electron beam is produced only when the light beam is scanned over the predefined active emission area of the photocathode.

Figure 9:
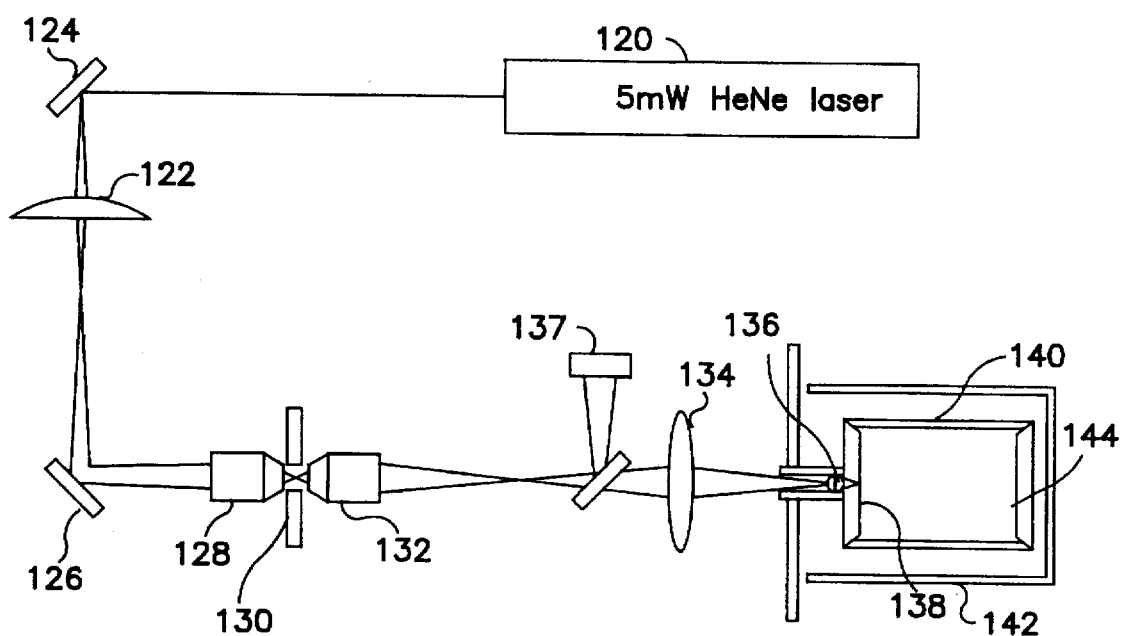
FIG. 9 is a block diagram of an experimental setup for measuring current density of an electron source in accordance with the invention.
Figure 10:
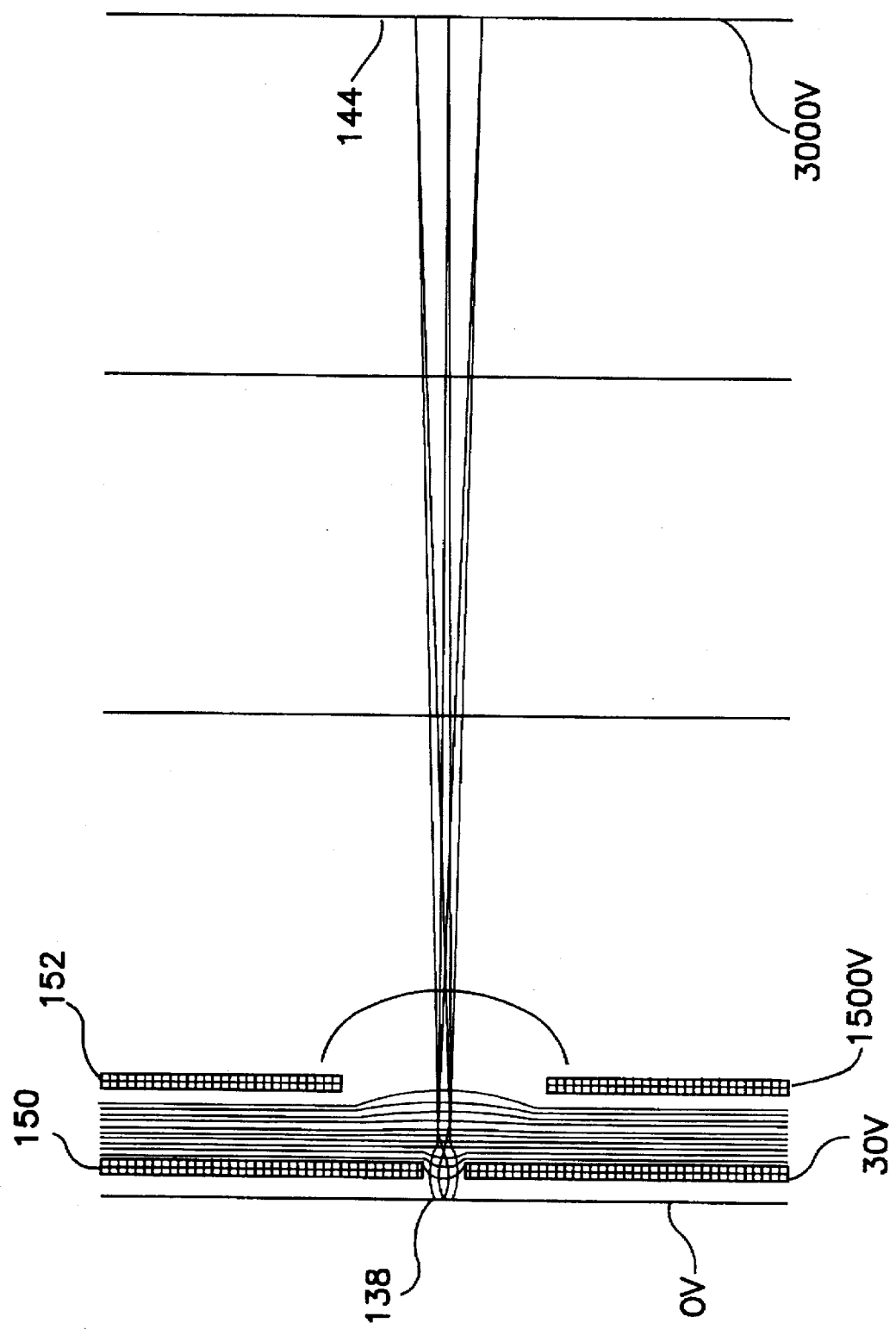
FIG. 10 illustrates a simulation of the electron optics used in the electron source of FIG. 9.
Figure 11:
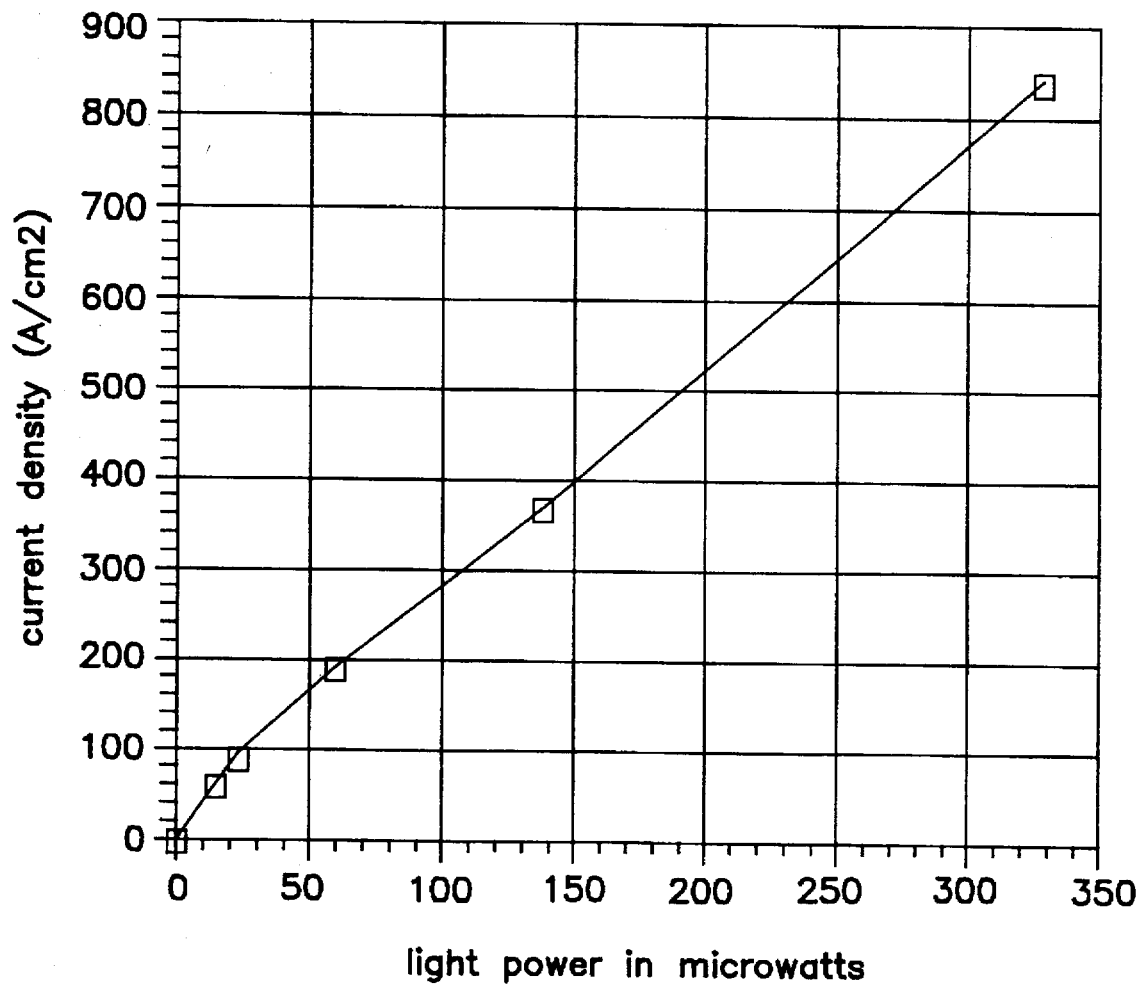
FIG. 11 is a graph of current density as a function of light power in the electron source of FIG. 9.

An experiment to demonstrate the present invention is described with reference to FIGS. 9–11. An experimental setup designed to achieve a very small active emission area on the photocathode is shown in FIG. 9. Light from a 5 milliwatt helium neon laser 120 was focused by a lens 122 and directed by mirrors 124 and 126 into a microscope objective 128. The microscope objective 128 focused the light through an aperture plate 130 having a pinhole with a dimension of three micrometers. A microscope objective 132 was used to collect light from the pinhole and focus it to an intermediate image. The intermediate image was focused onto the photocathode active emission area by a two lens system, including a lens 134 and a lens 136. The lens system was designed on SuperOSLO software to compensate for spherical aberration of the vacuum envelope on which the photocathode was mounted. With a 6.3×objective 132 collecting the light from the pinhole, the final image was nominally demagnified from the pinhole by 3×X. The lens system could be finely translated to achieve the best imaging on the photocathode surface. A photodiode 137 sensed the input light intensity. A photocathode 138 was mounted within an ultra high vacuum tube 140. The vacuum tube 140 was surrounded by a magnetic shield 142, having an opening for the light beam, to shield the tube from magnetic fields. The photocathode 138 had the structure specified in the example given above in connection with FIG. 2. The active layer of the photocathode was cleaned and etched and was transferred into an ultra high vacuum system where the active layer surface was exposed to cesium and oxygen to activate it to negative electron affinity. The photocathode structure was sealed on the input end of vacuum tube 140. The tube consisted of a stack of annular alumina spacers and kovar electrodes brazed into a cylinder that was ended by an output consisting of an aluminized phosphor 144 coated over a fiber optic output that carried the image on the phosphor to a surface where it could be imaged easily. The electrodes were two basic types: simple annular electrodes that did not extend into the interior volume of the tube, meant to exclude external fields and to define uniform fields with the tube; and specialized electrodes that extended into the tube with apertures for electron optics. The specialized electrodes, as well as the photocathode and the phosphor, were biased directly by DC power supplies. The annular electrodes were biased by resistor chains, with the resistor values proportional to the electrode-electrode distance to establish as close an approximation to a uniform field as possible. Electrodes 150 and 152 were used to implement a two electrode lens as shown in FIG. 10. The lens was used to focus the electrons emitted from the photocathode onto the phosphor 144 at the opposite end of the vacuum tube 140. The specialized electrodes were made from 5 mil Kovar and were evaporation coated with carbon after the tube was brazed together. Thus, all the areas exposed to the cathode and phosphor ends of the tube were coated. FIG. 10 illustrates a simulation of the imaging of the surface of photocathode 138 onto phosphor 144 with 5.4×magnification. The emitted electrons were accelerated and focused onto the phosphor 144 14.8 millimeters away.

The voltages applied to the photocathode, phosphor, and specialized electrodes (lens elements) are shown in FIG. 10. The light emitted by the phosphor, after being struck by the electrons imaged onto the phosphor, corresponded to a magnified image of the emission area of the photocathode. In this way the emission area was measured to have a diameter of approximately 1.74 microns, far smaller than has ever previously been reported.

The current density achievable from an emission area of this size was investigated. Keeping the light optics fixed, the electron optics were changed to provide a high field (3,000 volts per millimeter) at the cathode surface. The photocathode 138 was at −20 volts. The first electrode 150 was at 1,000 volts, the second electrode 152 was at −10 volts and the collector was set to 0 volts to collect the emitted electrons. This configuration was intended to minimize electron-stimulated desorption, while maintaining a large field on the photocathode. By removing filters from the light beam, the light level was increased, and the emitted electron current was measured. The results are shown in FIG. 11. If the diameter of the active emission area is assumed to stay the same as the current is increased, the current density can be approximated by assuming uniform emission over the diameter of the spot (1.74 micrometers). This technique yields 841 amps per square centimeter for the highest current level obtained. Although the uncertainty in the spot size translated to an uncertainty of approximately ±50% in the current density, the current densities demonstrated by this measurement are substantially higher than previously reported from a negative electron affinity photocathode.

While there have been shown and described what are at present considered the preferred embodiments of the present invention, it will be obvious to those skilled in the art that various changes and modifications may be made therein without departing from the scope of the invention as defined by the appended claims.

What is claimed is:

1. An electron source comprising:
   a negative electron affinity photocathode on a light-transmissive substrate, said photocathode having a conduction band and at least one active area for emission of electrons, said active area having one or more dimensions less than about two micrometers;
   a light beam generator for directing a light beam through said light-transmissive substrate at the active area of said photocathode for exciting electrons into the conduction band of said photocathode;
   electron optics for forming the electrons emitted from the active area of said photocathode into an electron beam; and
   a vacuum enclosure for maintaining said photocathode at high vacuum such that electrons in the conduction band of said photocathode have higher energies than electrons in the vacuum enclosure adjacent to said photocathode and have a high probability of emission into the vacuum enclosure from the active area of said photocathode.

2. An electron source as defined in claim 1 wherein the active area of said photocathode is defined by the light beam that is incident on said photocathode.

3. An electron source as defined in claim 1 wherein the active area of said photocathode is predefined.

4. An electron source as defined in claim 1 wherein the active area of said photocathode is predefined by a blocking layer on said photocathode, said blocking layer having an opening which defines the active area of said photocathode.

5. An electron source as defined in claim 1 wherein the active area of said photocathode is predefined by a high density of defects in the crystal structure near the surface of said photocathode, except in the active area of said photocathode.

6. An electron source as defined in claim 1 wherein said photocathode includes an activation layer which lowers the work function at the surface of said photocathode.

7. An electron source as defined in claim 1 wherein said photocathode comprises a semiconductor material.

8. An electron source as defined in claim 7 wherein said photocathode further comprises an activation layer for lowering the work function at the surface of said photocathode.

9. An electron source as defined in claim 8 wherein said activation layer comprises cesium oxide.

10. An electron source as defined in claim 1 wherein said photocathode comprises a column III-V compound.

11. An electron source as defined in claim 10 wherein said light beam has a wavelength in a range of about 300 nanometers to 800 nanometers.

12. An electron source as defined in claim 1 wherein said photocathode has a thickness of about one micrometer or less.

13. An electron source as defined in claim 1 wherein said light beam generator includes means for directing two or more light beams at two or more corresponding active areas of said photocathode.

14. An electron source as defined in claim 1 wherein said light beam generator includes means for scanning said light beam over the surface of said photocathode.

15. An electron source as defined in claim 1 wherein said light beam generator comprises a light source for generating light and optical elements for focusing said light into said light beam having predetermined dimensions at said photocathode.

16. An electron source as defined in claim 15 wherein said light source comprises a laser.

17. An electron source as defined in claim 1 wherein said light beam has a wavelength selected based on the absorption spectrum and the thickness of said photocathode.

18. An electron source as defined in claim 1 wherein said photocathode includes a bandgap ramp through the thickness thereof for producing an electric field within said photocathode.

19. An electron source as defined in claim 1 wherein said light beam generator includes means for modulating said light beam as a function of time.

20. An electron source as defined in claim 1 wherein said light beam has cross sectional dimensions of less than two micrometers when it impinges on said photocathode.

21. An electron source as defined in claim 1 wherein said photocathode comprises a diffusion blocking layer of AlGaAs or AlGaAsp, an active layer of GaAs, GaAsp, AlGaAs or InGaAsp, and an activation layer of $Cs_xO_y$.

22. An electron source comprising:
   a negative electron affinity photocathode on a light-transmissive substrate, said photocathode having a conduction band;
   a light beam generator for directing a light beam through said light-transmissive substrate at said photocathode for exciting electrons into the conduction band of said photocathode, said light beam having a cross-sectional area at said photocathode that is selected to produce an active area for emission of electrons with a dimension less than about two micrometers;
   electron optics for forming the electrons emitted from the active area of said photocathode into an electron beam; and
   a vacuum enclosure for maintaining said photocathode at high vacuum such that electrons in the conduction band of said photocathode have higher energies than electrons in the vacuum enclosure adjacent to said photocathode and have a high probability of emission into the vacuum enclosure from the active area of said photocathode.

23. An electron source as defined in claim 22 wherein said photocathode comprises an active layer of a Column III-V compound and an activation layer comprising cesium oxide.

24. An electron source as defined in claim 22 wherein said photocathode has a thickness of about one micrometer or less.

25. An electron source as defined in claim 1 wherein said photocathode includes a bandgap ramp through the thickness thereof for producing an electric field within said photocathode.

26. An electron source as defined in claim 22 wherein said light beam has a cross-sectional dimension of less than about two micrometers when it impinges on said photocathode.

27. An electron source comprising:

a negative electron affinity photocathode on a light-transmissive substrate, said photocathode having a conduction band and at least one predefined active area of less than about 2 microns in at least one dimension for emission of electrons;

a light beam generator for directing a light beam through said light-transmissive substrate at the predefined active area of said photocathode for exciting electrons into the conduction band of said photocathode;

electron optics for forming electrons emitted from the active area of said photocathode into an electron beam; and a vacuum enclosure for maintaining said photocathode at high vacuum such that electrons in the conduction band of said photocathode have higher energies than electrons in the vacuum enclosure adjacent to said photocathode and have a high probability of emission into the vacuum enclosure from the predefined active area of said photocathode.

28. An electron source as defined in claim 27 wherein the predefined active area of said photocathode is established by a blocking layer on said photocathode, said blocking layer having an opening which defines the active area of said photocathode.

29. An electron source as defined in claim 27 wherein the predefined active area of said photocathode is established by a high density of defects in the crystal structure near the surface of said photocathode, except in the predefined active area of said photocathode.

30. An electron source as defined in claim 27 wherein said photocathode includes a bandgap ramp through the thickness thereof for producing an electric field within said photocathode.

31. An electron beam system comprising:

an electron source comprising:

a negative electron affinity photocathode on a light-transmissive substrate, said photocathode having a conduction band and at least one active area for emission of electrons, said active area having one or more dimensions less than about two micrometers;

a light beam generator for directing a light beam through said light-transmissive substrate at the active area of said photocathode for exciting electrons into the conduction band of said photocathode;

electron optics for forming the electrons emitted from the active area of said photocathode into an electron beam; and a vacuum enclosure for maintaining said photocathode at high vacuum such that electrons in the conduction band of said photocathode have higher energies than electrons in the vacuum enclosure adjacent to said photocathode and have a high probability of emission into the vacuum enclosure from the active area of said photocathode;

a main vacuum enclosure for receiving said electron beam from said electron source and for holding a workpiece for processing by said electron beam, and main electron optics located within said main vacuum enclosure for directing said electron beam to said workpiece.

* * * * *